(12) United States Patent
Cich et al.

(10) Patent No.: US 9,379,280 B2
(45) Date of Patent: Jun. 28, 2016

(54) CONTACTS FOR AN N-TYPE GALLIUM AND NITROGEN SUBSTRATE FOR OPTICAL DEVICES

(71) Applicant: SORAA, INC., Fremont, CA (US)

(72) Inventors: Michael J. Cich, Fremont, CA (US); Kenneth John Thomson, Fremont, CA (US)

(73) Assignee: SORAA, Inc., Fremont, CA (US)

( * ) Notice: Subject to any disclaimer, the term of this patent is extended or adjusted under 35 U.S.C. 154(b) by 0 days.

(21) Appl. No.: 14/827,709

(22) Filed: Aug. 17, 2015

(65) Prior Publication Data

US 2015/0357513 A1 Dec. 10, 2015

Related U.S. Application Data

(60) Continuation of application No. 14/629,049, filed on Feb. 23, 2015, now Pat. No. 9,112,116, which is a division of application No. 13/937,338, filed on Jul. 9, 2013, now Pat. No. 8,994,033.

(51) Int. Cl.
| | |
|---|---|
| *H01L 29/15* | (2006.01) |
| *H01L 31/0256* | (2006.01) |
| *H01L 33/00* | (2010.01) |
| *H01L 33/22* | (2010.01) |
| *H01L 33/38* | (2010.01) |
| *H01L 33/40* | (2010.01) |
| *H01L 33/32* | (2010.01) |

(52) U.S. Cl.
CPC ............ *H01L 33/0075* (2013.01); *H01L 33/22* (2013.01); *H01L 33/38* (2013.01); *H01L 33/40* (2013.01); *H01L 33/405* (2013.01); *H01L 33/32* (2013.01); *H01L 33/382* (2013.01); *H01L 2933/0008* (2013.01); *H01L 2933/0016* (2013.01); *H01L 2933/0033* (2013.01)

(58) Field of Classification Search
CPC .................................. H01L 33/32; H01L 33/22
USPC ....................... 257/13, 76, 33.012; 438/46, 34
See application file for complete search history.

(56) References Cited

U.S. PATENT DOCUMENTS

| | | | | |
|---|---|---|---|---|
| 2003/0213964 A1* | 11/2003 | Flynn | ....................... | C30B 23/00 257/85 |
| 2009/0020781 A1* | 1/2009 | Lai | .......................... | H01L 33/22 257/103 |
| 2010/0009483 A1* | 1/2010 | Jiang | ....................... | H01L 33/22 438/39 |
| 2011/0012233 A1* | 1/2011 | Ishibashi | ............... | C30B 29/403 257/615 |

* cited by examiner

*Primary Examiner* — Jami M Valentine

(74) *Attorney, Agent, or Firm* — Saul Ewing LLP

(57) ABSTRACT

A method for fabricating LED devices. The method includes providing a gallium and nitrogen containing substrate member (e.g., GaN) comprising a backside surface and a front side surface. The method includes subjecting the backside surface to a polishing process, causing a backside surface to be characterized by a surface roughness, subjecting the backside surface to an anisotropic etching process exposing various crystal planes to form a plurality of pyramid-like structures distributed spatially in a non-periodic manner on the backside surface, treating the backside surface comprising the plurality of pyramid-like structures, to a plasma species, and subjecting the backside surface to a surface treatment. The method further includes forming a contact material comprising an aluminum bearing species or a titanium bearing species overlying the surface-treated backside to form a plurality of LED devices with the contact material.

19 Claims, 5 Drawing Sheets

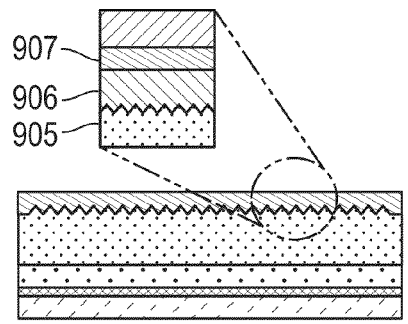
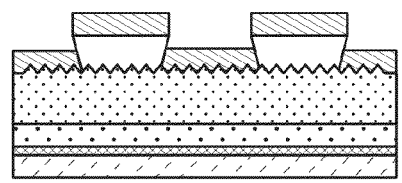
FIG. 9A        FIG. 9B
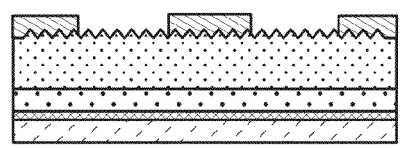
FIG. 10
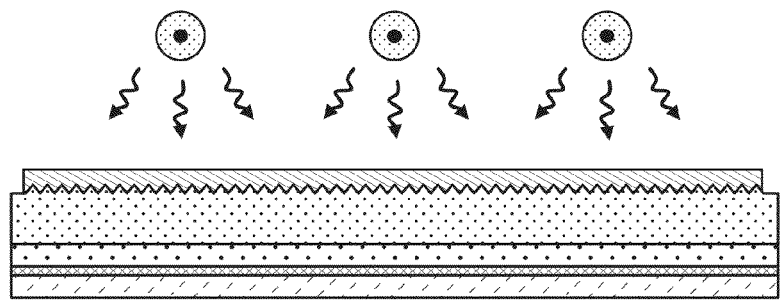
FIG. 11

CONTACTS FOR AN N-TYPE GALLIUM AND NITROGEN SUBSTRATE FOR OPTICAL DEVICES

CROSS-REFERENCE TO RELATED APPLICATIONS

This is a continuation of U.S. application Ser. No. 14/629,049, filed Feb. 23, 2015, which is a divisional of U.S. application Ser. No. 13/937,338, filed Jul. 9, 2013, the entire contents of each of which being fully incorporated herein by reference.

BACKGROUND

A metric for the efficiency of light emitting diodes (LEDs) is the luminance per watt. The luminance provided by light emitting diodes depends on several factors such as internal quantum efficiency, which quantifies the fraction of injected carriers converted to photons, and extraction efficiency, which quantifies the fraction of photons successfully extracted from the light emitting diode. Internal absorption may prevent photons from escaping the light emitting diode. To realize high efficiency LEDs, both the internal efficiency and extraction efficiency should be optimized. The potential gains from improving extraction efficiency, however, are likely to be greater and simpler to accomplish than are gains from improving internal efficiency.

From the above, it can be appreciated that improved techniques for manufacturing optical devices are highly desired.

SUMMARY

The present invention relates to techniques for manufacturing optical devices. More particularly, the present invention is directed to light emitting diodes and in particular to ohmic contacts for light emitting diodes.

In an example, the present invention provides a method for fabricating LED devices. The method includes providing a gallium and nitrogen containing substrate member (e.g., GaN) comprising a backside surface and a front side surface. The front side surface includes an n-type material overlying the substrate member, an active region overlying the n-type material, and a p-type material overlying the active region. The method includes subjecting the backside surface to a polishing process, causing a backside surface characterized by a surface roughness. The method also includes subjecting the backside surface to an anisotropic etching process exposing various crystal planes to form a plurality of pyramid-like structures distributed spatially in a non-periodic manner on the backside surface. The method includes treating the backside surface, comprised of a plurality of pyramid-like structures, to a plasma species, and subjecting the backside surface to a surface treatment. The method forms a contact material comprising an aluminum bearing species or a titanium bearing species overlying the surface-treated backside to form a plurality of LED devices with the contact material.

In an example, the present invention provides an optical device, e.g., a LED device. The device has a gallium and nitrogen containing substrate member comprising a backside surface and a front side surface, which includes an n-type material overlying the substrate member, an active region overlying the n-type material, and a p-type material overlying the active region. The device has a plurality of pyramid-like structures distributed spatially in a non-periodic manner on the backside surface and a contact material comprising an aluminum bearing species or a titanium bearing species overlying the surface-treated backside to form a plurality of LED devices with the contact material.

In an example, the backside surface is characterized by a nitrogen face of a c-plane and an n-type GaN with carrier concentration ranging from $1E15/cm^3$ to $1E20/cm^3$. In an example, the surface roughness ranges from about 0.3 nm to 200 nm. In an example, each of the plurality of pyramid-like structures has a height from about 20 nm to 1000 nm. In an example, the active region is configured to emit electromagnetic radiation in a range of 450 nm to 480 nm. In an example, the active region comprises a plurality of quantum well structures. In an example, each of the pyramid-like structures comprises three sides or two or more sides.

Various additional objects, features, and advantages of the present invention can be more fully appreciated with reference to the detailed description and accompanying drawings that follow.

BRIEF DESCRIPTION OF THE DRAWINGS

FIGS. 9A and 9B are illustrations of metal layers deposited on the n-GaN surface (the stack begins with a first layer of Al or Ti, followed by a barrier layer) according to embodiments of the present invention.

FIG. 10 illustrates a device structure after photoresist and unwanted metal are removed in a liftoff process according to embodiments of the present invention.

FIG. 11 illustrates a metal annealing process to reduce the contact resistance according to embodiments of the present invention.

DETAILED DESCRIPTION

Figure 1:
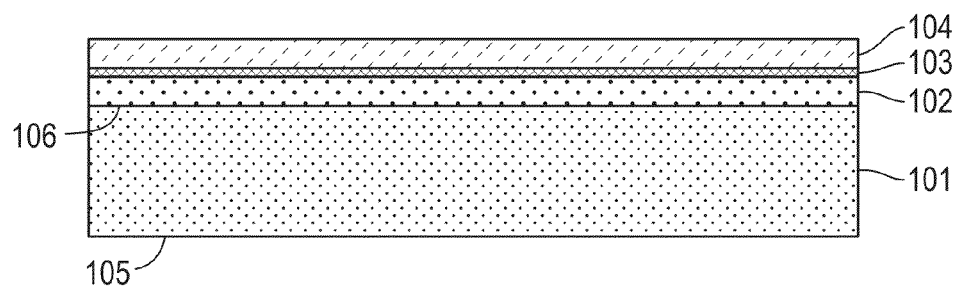
FIG. 1 is a simplified diagram of an n-type c-plane GaN substrate with an epitaxial LED structure (n-layer, active region, p-layer) according to embodiments of the present invention.

The present invention relates to techniques for manufacturing optical devices. More particularly, the present invention includes light emitting diodes and in particular, ohmic contacts for light emitting diodes. Such light emitting devices can include LEDs, lasers and the like.

As background, we have observed that conventional GaN-based light emitting diodes (LED) emitting in the ultraviolet and visible regions are based on heteroepitaxial growth where growth is initiated on a substrate other than GaN such as sapphire, silicon carbide, or silicon. This is due to the limited supply and high cost of free-standing GaN substrates, which has prevented their viability for use in high volume LED manufacture. However, the field of bulk-GaN technology has seen rapid gains over the past couple of years providing promise for large-scale deployment into LED manufacture. Such a technology shift will provide huge benefits to LED performance and manufacturing.

Light extraction of LEDs emitting in the visible portion of the spectrum, such as gallium nitride (GaN) LEDs, can be improved with high reflectivity metallurgies, which are typically mounted to one side of the LED. A desirable electrical contact to a GaN-based device has a reduced impact on the operating voltage of the device. This can be accomplished with the use of ohmic contacts. Thus, a desirable metal contact to an LED is both ohmic and highly reflective. A common approach for making contacts to p-GaN is to use a silver-containing layer. Silver is desirable because of its high reflectance across a large portion of the visible spectrum. Though highly reflective, silver does not make good electrical contacts to n-GaN. The carrier energies in n-GaN dictates that a metal with a different work function be used to provide ohmic contacts. However, metal reflectivity and work function are not the sole concerns of ohmic contact formation. The processing method should also address surface contamination, and in the case of GaN, relative amounts of exposed Ga and N atoms at the surface. Therefore, making metal contacts to GaN LEDs is a complex endeavor that should take into consideration optical and electrical metal properties, semiconductor crystal properties and surface chemistry.

Progress has been made during the past decade and a half in the performance of gallium nitride (GaN) based light emitting diodes (LEDs). Devices with a luminous efficiency greater than 100 lumens per watt have been demonstrated in the laboratory, and commercial devices have an efficiency that is already considerably superior to that of incandescent lamps and is competitive with fluorescent lamps. Further improvements in efficiency can reduce operating costs, reduce electricity consumption, and decrease emissions of carbon dioxide and other greenhouse gases produced in generating the energy used for lighting applications.

In an embodiment, a method of producing an ohmic contact to n-type GaN is provided. This method involves three steps, starting with a polished GaN surface: an alkaline treatment, a plasma treatment, and an acid treatment. The alkaline treatment can be central to the success of the method because it produces fine scale roughness that exposes alternate crystal facets, which may be more favorable to ohmic contact formation. The plasma treatment and acid treatment are more in line with conventional surface cleaning methods before metal deposition.

Ohmic contacts are desirable for manufacturing LEDs with high electrical efficiency. There have been attempts to manufacture contacts to LEDs using different metallization pre-treatments, metal thin film stacks, and annealing treatments to obtain ohmic contacts to n-type and p-type GaN. For LEDs, it is also desirable to have an ohmic contact metal with high reflectivity. In addition, lower annealing temperatures are generally favored.

For example, a present method for fabricating a device with an ohmic n-contact includes laser scribing Ti/Au contacts. This method forms (e.g., cuts, etches, patterns, drills, machines) trenches into the n-contacts approximately 10 microns to 30 microns deep. The laser scribe effectively anneals the n-contact metal at a very high temperature and mixes it into the GaN. However, the trenches become filled with a high optical loss metal alloy, and the surface of the contacts become covered with burned metal which makes it difficult to test the contacts and impacts wire-bond yield and reliability due to gradual intermetallic reactions. This disclosure describes a method for achieving low contact resistance to n-type GaN using a chemical solution that produces a small-scale (height <0.1 micron; pitch <2 microns) roughness on the GaN surface. Further details of the present invention can be found throughout the present specification and more particularly below.

FIG. 1 is a simplified diagram of an n-type c-plane GaN substrate 101 with epitaxial LED structure (n-layer 102, active region 103, p-layer 104) according to embodiments of the present invention. As shown, the method begins with a gallium and nitrogen containing substrate member. The substrate includes a backside surface 105 and a front side surface 106. The front side surface includes an n-type material overlying the substrate member, an active region overlying the n-type material, and a p-type material overlying the active region. Preferably, the active region has one or more quantum wells that emit light at visible or ultraviolet wavelengths.

Figure 2:
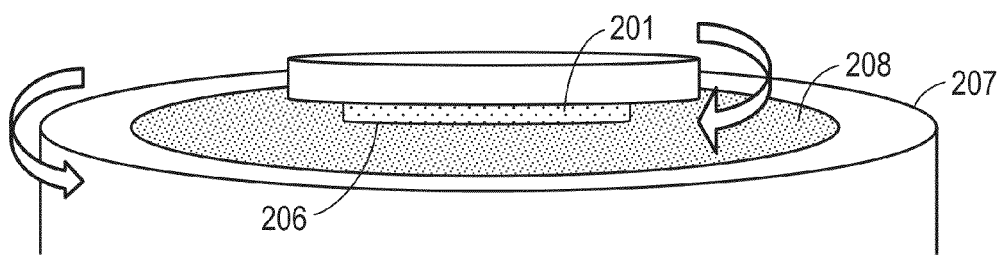
FIG. 2 illustrates polishing of the n-type c-plane GaN substrate with a diamond slurry to form an optically smooth (RMS surface roughness 100 nm or less) backside surface according to embodiments of the present invention.

FIG. 2 illustrates polishing of n-type substrate 201 with diamond slurry until optically smooth (RMS surface roughness 100 nm or less) according to embodiments of the present invention. As shown, the method includes subjecting the backside surface 206 to polishing process to cause the backside surface characterized by a surface roughness of 100 nanometers RMS. Wafers are mounted on a rotating plate 207, which sits on a large polyurethane impregnated polyester felt polishing pad 208. The polishing pad is rotated at rate ranging from about 5 rpm to 200 rpm or about 60 rpm and others, while the plate with the wafers rotates at about 1 rpm to 25 rpm and in certain embodiments about 10 rpm. A slurry mixture is a suspension of suitably-sized abrasive particles ranging in size from about 0.05 µm to 5 µm, and in certain embodiments 1 µm diamond particles or other abrasive species such as other metals, semiconductors, conductors and their combinations e.g., SiC, diamond, $Al_2O_3$, or GaN. The slurry mixture also includes a neutral solvent such as water and/or alcohol and can also be acidic or basic. The slurry mixture is dispensed onto the polishing pad during the method.

Figure 3:
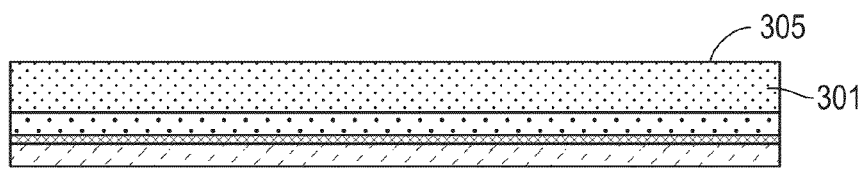
FIG. 3 shows a substrate with an optically smooth nitrogen face of c-plane GaN, prepared by polishing or by lapping and polishing according to embodiments of the present invention.

FIG. 3 shows a substrate 301 with an optically smooth nitrogen face of c-plane GaN surface, prepared by polishing or by lapping and polishing according to embodiments of the present invention. As shown, the optically smooth nitrogen face is characterized by a surface roughness of between 200 nm RMS and 0.3 nm RMS. As used herein, the term nitrogen face means an outermost and/or surface region and/or layer of atoms comprising substantially of nitrogen atoms, although there may be some variations, or other meanings consistent with the understanding of one of ordinary skill of the art. As an example, a nitrogen face can include an exposed c-plane.

Figure 4:
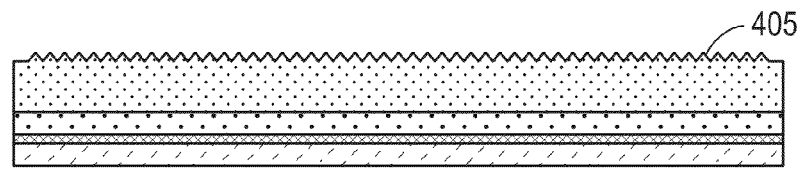
FIG. 4 shows an n-GaN surface roughened by exposure to a solution of silicic acid hydrate, potassium hydroxide, and water according to embodiments of the present invention.

FIG. 4 shows an n-GaN surface 405 roughened by exposure to a solution of silicic acid hydrate, potassium hydroxide (KOH), and water according to embodiments of the present invention. The solution of silicic acid hydrate, KOH, and water are mixed in the proportion of about 60 g silicic acid hydrate per liter of 9% KOH solution. The height and pitch of the roughness can be controlled by the silicic acid and KOH concentrations. The temperature of the etchant is held at 60° C. The etchant can be continuously agitated to provide uniformity of roughness. Although the method used a selected chemistry and conditions for the etchant, there can be variations. For example, the acid can also be boric acid, chlorosulfonic acid, sulfamic acid, or others. As shown, the method subjects the backside surface to crystal plane dependent etching process to form a plurality of pyramid-like structures formed spatially in an even manner on the backside surface, as further shown by the Figure below. Each of the pyramid-like structures generally includes at least 6 sides configured and extending from an apex to a base region. The pyramid-like structures are configured such that each of the base regions substantially cover a plane in a manner where the base regions are coupled to each other without exposing the plane. At least 80% of the pyramid-like structures have a base region having a normalized size ranging from 0.3 to 3 relative to the median base size. In one example, the median base size is 0.5 µm. The plurality of the pyramid-like structures can form a non-periodic spatial pattern, although there may be variations. In an example, the distance between the base and the apex is twice the length of the base.

Figure 5:
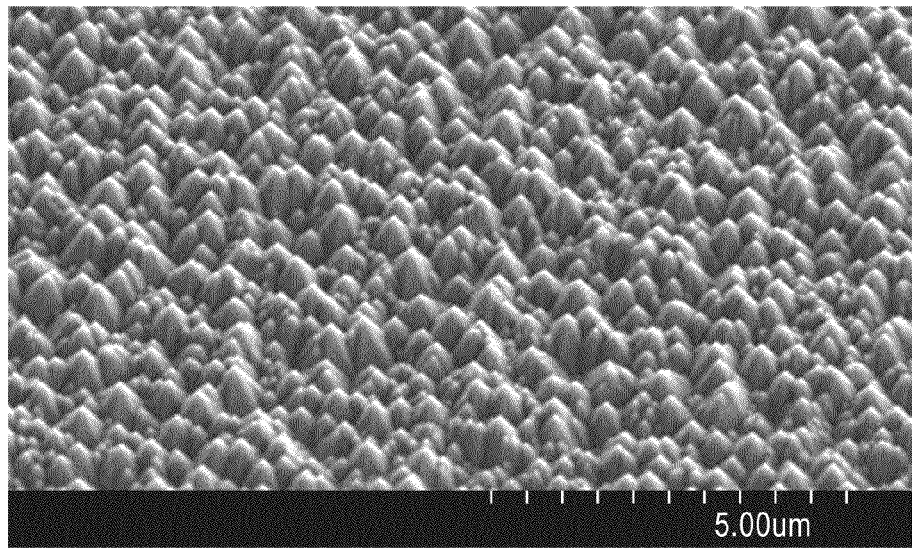
FIG. 5 shows a scanning electron microscope image of a roughened n-GaN surface after exposure to a solution of silicic acid hydrate, potassium hydroxide, and water according to embodiments of the present invention.

FIG. 5 shows a scanning electron microscope image of a roughened n-GaN surface after exposure to a solution of silicic acid hydrate, KOH, and water according to embodiments of the present invention.

Figure 6:
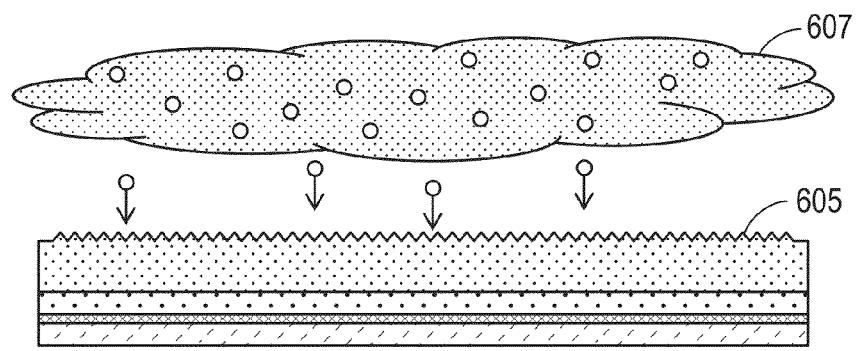
FIG. 6 shows a n-GaN surface etched by $SiCl_4$ plasma according to embodiments of the present invention.

FIG. 6 shows a n-GaN surface 605 etched by a $SiCl_4$ plasma 607 according to embodiments of the present invention. Although the $SiCl_4$-based plasma is described, there can be variations. As shown, the method treats the backside surface comprising the plurality of pyramid-like structures to a plasma treatment. The plasma can be created by applying a bias voltage across $SiCl_4$ gas. In this example, the subject plasma treatment processes the roughened GaN surface to achieve an ohmic contact. It is believed that the plasma surface treatment alters a chemical characteristic of the roughened GaN surface to facilitate the ohmic contact formation.

Figure 7:
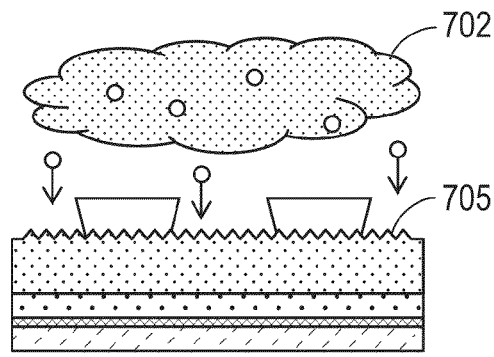
FIG. 7 shows an illustration of a photoresist-patterned substrate treated with an oxygen plasma, followed by a $SiCl_4$ plasma treatment (when the n-contacts will be patterned using a liftoff process) according to embodiments of the present invention.

FIG. 7 shows an illustration of a photoresist-patterned substrate treated with an oxygen plasma, followed by a $SiCl_4$ plasma treatment (when the n-contacts will be patterned using a liftoff process) according to an embodiment of the present invention. As shown, the photoresist patterned wafer 705 is exposed to an oxygen plasma 702, which removes residual organic contaminants in the contact windows. This is followed by a $SiCl_4$ plasma treatment. The present technique using the oxygen plasma provides a residue-free surface.

Figure 8A:
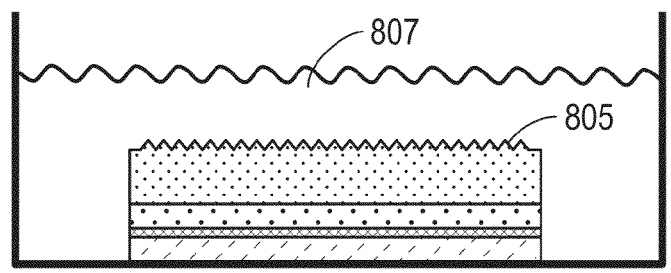
FIGS. 8A and 8B illustrate a process for hydrochloric acid (HCl) treatment of an n-GaN surface, with or without patterned photoresist, according to embodiments of the present invention.
Figure 8B:
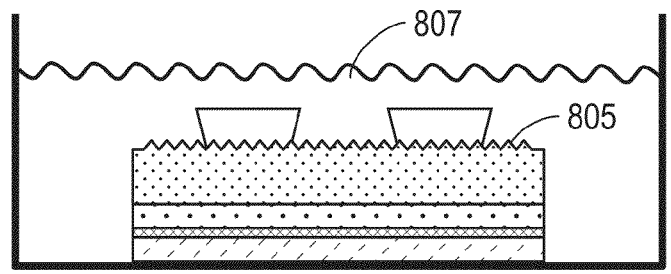

FIGS. 8A and 8B illustrate a process for HCl treatment of an n-GaN surface, with (FIG. 8A) or without (FIG. 8B) patterned photoresist according to embodiments of the present invention. The method subjects the n-GaN surface 805 to hydrochloric acid 807. Typically the HCl is an aqueous solution with a concentration of 38% by weight and may be diluted. Other treatments including acids of other types may be used. This surface treatment may be performed at room temperature or elevated temperatures, and extends for 1 minutes to 20 minutes in duration in an example. In this example, the subject acid treatment processes the roughened GaN surface to achieve an ohmic contact. It is believed that the acid treatment alters a chemical characteristic of the roughened GaN surface to facilitate ohmic contact formation.

FIGS. 9A and 9B are an illustrations of metal layers deposited on the n-GaN surface 905, without (FIG. 9A) and with (FIG. 9B) patterned photoresist. A stack or single layer begins with a first layer 906 of Al or Ti according to embodiments of the present invention. The stack can include any combination of suitable conductive materials with barrier and/or glue layers 907. The stack can be a homogeneous structure, a graded structure or composed of discrete stacked regions or any combination of the aforementioned and the like. Other suitable metals may be used, including Zn, Ag, Au, W, Cr, Ni, or others including, but not limited to, alloys. As shown, the method includes a blanket deposition of contact material comprising an aluminum bearing species or a titanium bearing species overlying the treated n-GaN surface to form a plurality of LED devices using this contact material.

FIG. 10 illustrates the resultant patterned metal on a substrate where organic solvents can be used to remove photoresist and unwanted metal in a liftoff process according to embodiments of the present invention. As an example, suitable solvents include N-methyl-2-pyrrolidone (NMP) or acetone followed by methanol and isopropanol. Other processes may be used to pattern the metal, including an etchback process.

FIG. 11 illustrates a process for metal annealing to lower the contact resistance according to embodiments of the present invention. The final contact structure is subjected to annealing in a nitrogen or forming gas (nitrogen and hydrogen) environment. The temperature can range from 200° C. to 450° C.

Figure 12:
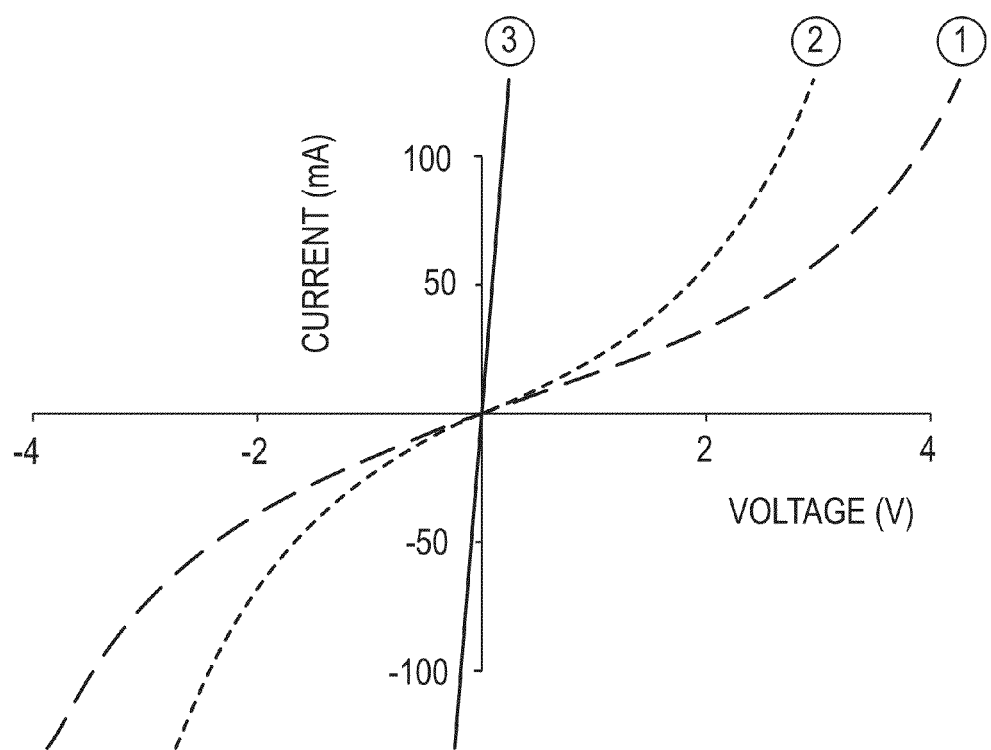
FIG. 12 illustrates an example of current as a function of voltage between two aluminum contacts on an n-GaN surface treated according to method provided by the present disclosure, compared to contacts to an untreated n-GaN surface.

FIG. 12 illustrates the current between two aluminum contacts on n-GaN for varying voltage. The first curve (1) shows a typical result when aluminum is placed on n-GaN without chemical roughening treatment or plasma exposure. The second curve (2) shows the improvement when the surface is exposed to silicic acid/KOH roughening solution, $SiCl_4$ plasma treatment, and HCl cleaning. The third curve (3) shows the result when the contacts in curve 2 are annealed at 340° C. for 5 s. In an example, the diagram relates to current-voltage curves for a pair of aluminum contacts on n-GaN. Curve (1) contacts received no surface roughening or annealing. Curve (2) contacts were not annealed. Curve (3) contacts received the complete sequence of steps.

In an example, the present method includes the following sequence of steps.

(1) Lap and polish the nitrogen face of c-plane, n-type GaN with carrier concentration $1E18/cm^3$.

(2) Mix a silicic acid-potassium hydroxide solution, with the composition of 14.6 g of silicic acid hydrate, 20 mL of 45% KOH solution, and 100 mL of water.

(3) Immerse the substrate in the silicic acid-potassium hydroxide solution for 15 min at 60° C.

(4) Perform standard n-contact liftoff lithography.
   a. Lithography is not required except to form the contact pattern. This step may be omitted and a blanket deposition/etchback used.

(5) Descum (optional). May be ozone clean, oxygen plasma, or no treatment.

(6) Expose the sample to $SiCl_4$ plasma.
   a. Reactive ion etching at 400 W and 30 mTorr $SiCl_4$.

(7) Deionized water rinse.

(8) Immerse the sample in HCl (37%) for 5 min.

(9) Deionized rinse.

(10) Deposit contact metallization, such as evaporated aluminum, aluminum/nickel/gold, or titanium/gold.

(11) Anneal. Depending on the treatment conditions, contacts are ohmic as deposited, or mild annealing between 200° C. and 450° C. to produce ohmic contacts.

This sequence of steps is merely illustrative, and should not limit the scope of the claims herein. Depending upon the embodiment, the steps may be further combined, or other steps may be added. Alternatively, the steps may be reordered, depending upon the embodiment.

GaN substrates that underwent plasma exposure only, or acid clean only, had high-resistance contacts. Plasma exposures included both SiCl$_4$ plasma and chlorine-based plasmas. Acid cleans included HCl, buffered oxide etch, and HF. GaN substrates with both plasma exposure and acid clean sometimes had ohmic contacts as deposited, but these changed to high-resistance contacts on mild annealing (340° C., 5 s). Substrates with alkaline clean, plus plasma treatment and acid dip, had generally high resistance contact as-deposited, but the contact resistance dropped below the current laser-scribed value after a 340° C., 5 s anneal.

It should be understood that the description recited above is an example of the invention and that modifications and changes to the examples may be undertaken which are within the scope of the claimed invention. Therefore, the scope of the appended claims should be accorded the broadest interpretation so as to encompass all such modifications and similar arrangements, including a full scope of equivalents.

What is claimed is:

1. A method for roughening a semiconductor structure comprising at least a III-Nitride material and having at least one nitrogen-face side having an initial roughness, said method comprising:
   contacting said side with at least one mixture containing an acid and an alkali hydroxide, thereby roughening said side to a second roughness, said second roughness being rougher than said initial roughness.

2. The method of claim 1, wherein said alkali hydroxide comprises potassium hydroxide.

3. The method of claim 2, wherein said acid is at least one of silicic acid, boric acid, chlorosulfonic acid, sulfamic acid.

4. The method of claim 3, wherein said at least one mixture comprises at least potassium hydroxide and silicic acid.

5. The method of claim 1, wherein said initial roughness has an RMS roughness lower than 100 nm.

6. The method of claim 1, wherein said second roughness comprises at least a plurality of pyramid-like structures, having an apex and a base.

7. The method of claim 6, wherein at least a portion of said pyramid-like structures have six sides extends from said apex to said base.

8. The method of claim 6, wherein at least a portion of said pyramids have a nominal base dimension of about 5 um.

9. The method of claim 6, wherein the bases of said pyramid-like structures are substantially contiguous to define a plane.

10. The method of claim 6, wherein at least 80% of said pyramid-like structures have a base having a normalized size ranging from 0.3 to 3 relative to the median base size of said pyramid-like structures.

11. The method of claim 1 further comprising subsequently contacting said side with a second mixture containing at least one of an acid or an alkali hydroxide.

12. The method of claim 1, wherein said at least one mixture comprises at least 0% to 20% by weight of silicic acid hydrate and 3% to 45% by weight of alkali hydroxide in water.

13. The method of claim 1, wherein said at least one mixture contacts said side for at least 1 minute.

14. The method of claim 1, wherein said at least one mixture contacts said side at between 0° C. and 100° C.

15. The method of claim 1, wherein said contacting comprises continuously agitating said at least one mixture to provide uniformity of roughness.

16. The method of claim 1, wherein said semiconductor structures comprises light-emitting layers.

17. The method of claim 1, wherein said side is n-doped.

18. A semiconductor structure made from the method of claim 1.

19. A semiconductor structure made from the method of claim 12.

* * * * *